(12) United States Patent
Cheng

(10) Patent No.: US 6,396,428 B1
(45) Date of Patent: May 28, 2002

(54) CONTINUOUS TIME BANDPASS DELTA SIGMA MODULATOR ADC ARCHITECTURE WITH FEEDFORWARD SIGNAL COMPENSATION

(75) Inventor: William W. Cheng, Redondo Beach, CA (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/873,897

(22) Filed: Jun. 4, 2001

(51) Int. Cl.[7] .................................................. H03M 3/00
(52) U.S. Cl. ....................................... 341/143; 341/155
(58) Field of Search ................................. 341/143, 126, 341/144, 155

(56) References Cited

U.S. PATENT DOCUMENTS

| | | | |
|---|---|---|---|
| 5,274,375 A | 12/1993 | Thompson | 341/143 |
| 5,351,050 A | 9/1994 | Thompson et al. | 341/143 |
| 5,682,161 A | 10/1997 | Ribner et al. | 341/143 |
| 5,793,811 A | 8/1998 | Yu | 375/247 |
| 6,028,544 A | 2/2000 | Zarubinsky et al. | 341/143 |
| 6,249,237 B1 * | 7/2001 | Prater | 341/143 |

OTHER PUBLICATIONS

IEEE Journal of Solid–State Circuits, An Eighth–Order Bandpass Delta Sigma Modulator for A/D Conversion in Digital Radio by Loai Louis, John Abeaarius, and Gordon W. Roberts, Member, IEEE, vol. 34, No. 4, Apr. 1999, pp. 423–431.

IEEE Journal of Solid–State Circuits, A 3.2 GHz Second–Order Delta–Sigma Modulator Implemented in InP HBT Technology, vol. 30, No. 10, Oct. 1995, pp. 1119–1126.

* cited by examiner

*Primary Examiner*—Brian Young
(74) *Attorney, Agent, or Firm*—Leonard A. Alkov; Glenn H. Lenzen, Jr.

(57) ABSTRACT

A continuous time Bandpass Delta Sigma (ΔΣ) Modulator architecture with feedforward and feedback coefficients to completely specify both the signal transfer function (STF) and the noise transfer function (NTF) for a stable modulator ADC system.

13 Claims, 4 Drawing Sheets

6th Order ΔΣ Modulator NTF
Frequency Response From FFT

6th Order ΔΣ Modulator STF & NTF
Frequency Response

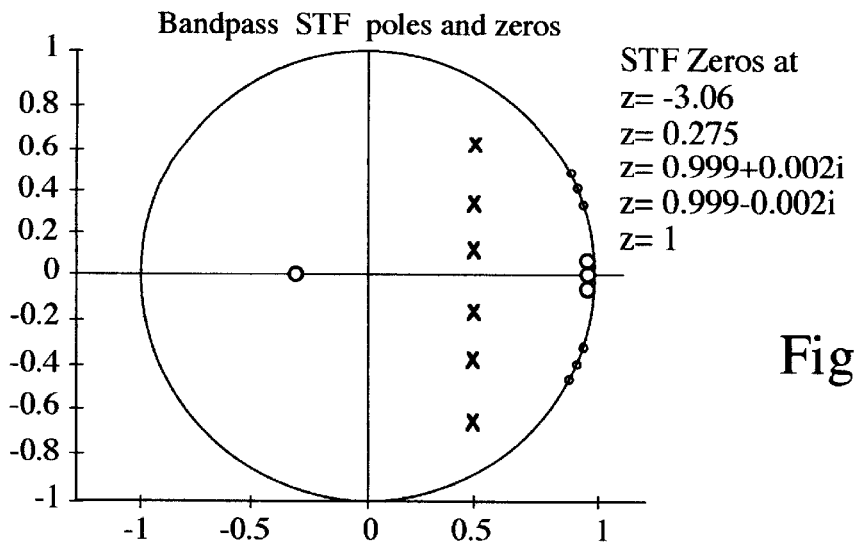
Fig. 5
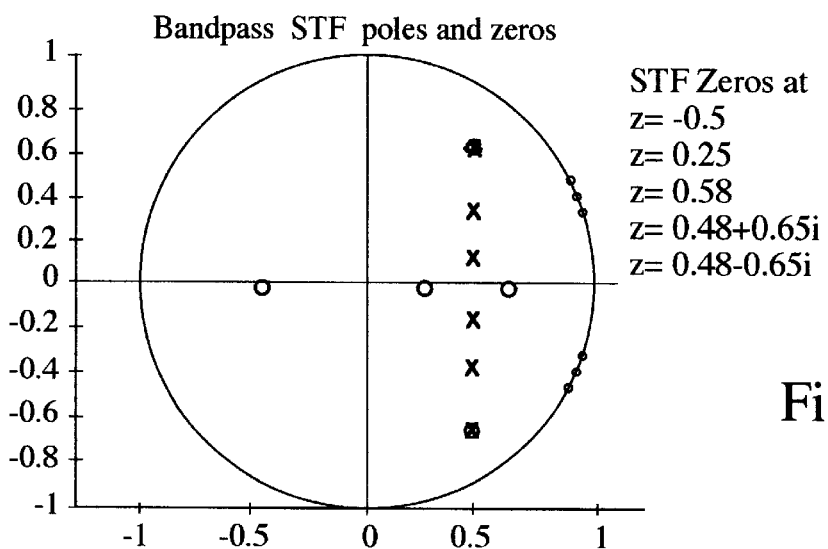
Fig. 6
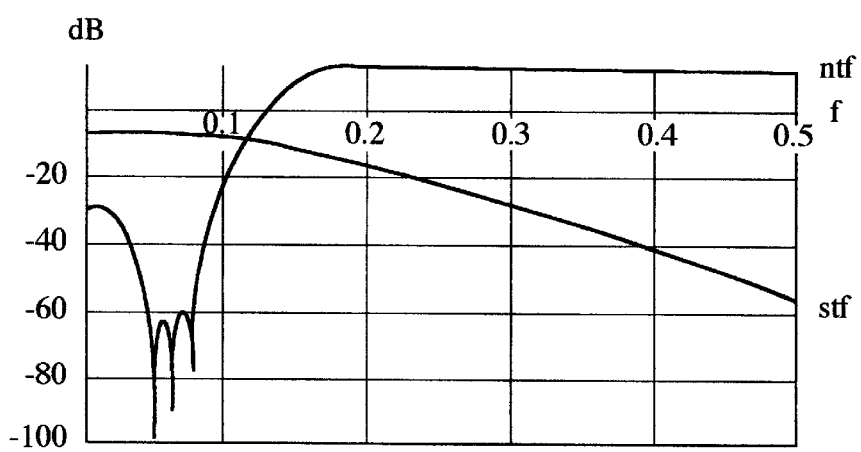
6th Order ΔΣ Modulator STF & NTF Frequency Response

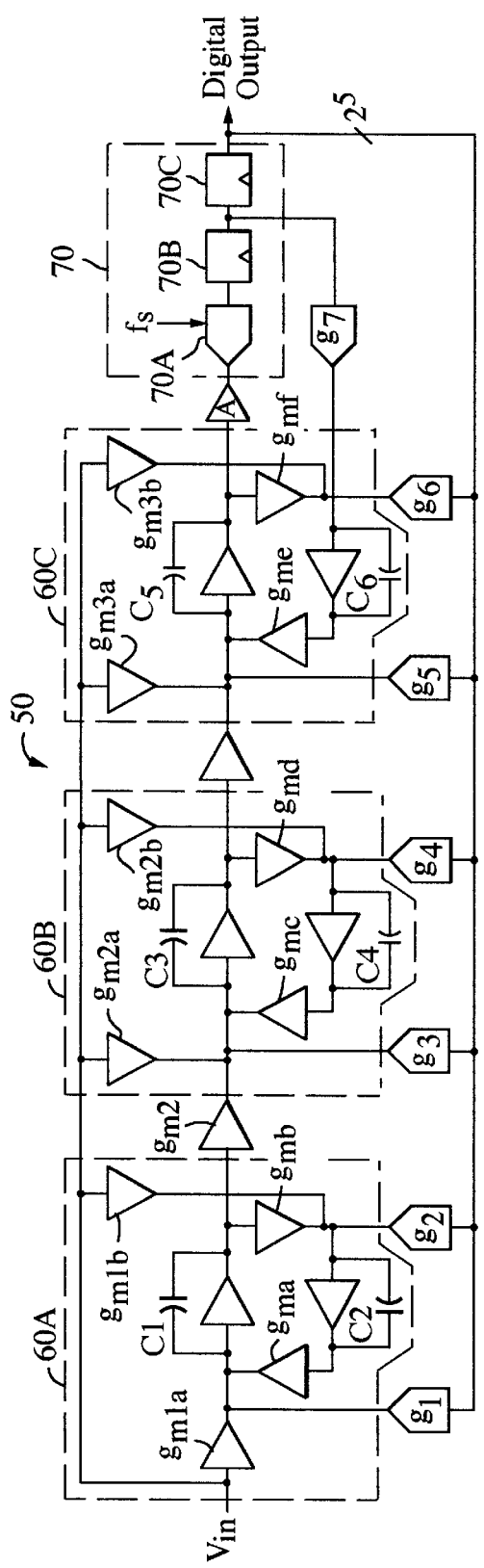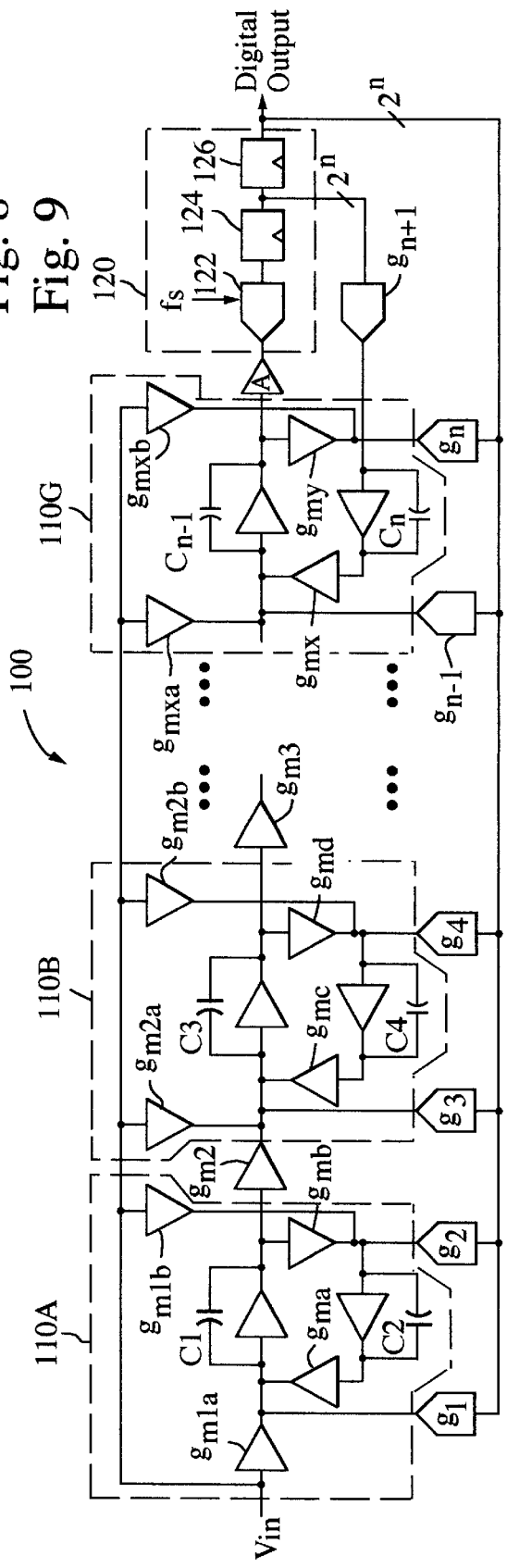
Fig. 8
Fig. 9

CONTINUOUS TIME BANDPASS DELTA SIGMA MODULATOR ADC ARCHITECTURE WITH FEEDFORWARD SIGNAL COMPENSATION

This invention was made with Government support under Contract No. N66001-97-C-8004 awarded by the Department of the Navy. The Government has certain rights in this invention.

TECHNICAL FIELD OF THE INVENTION

This invention relates to analog-to-digital converters (ADCs).

BACKGROUND OF THE DISCLOSURE

Continuous time Bandpass Delta Sigma ($\Delta\Sigma$) modulators are used in ADC systems for digitizing signals of wide dynamic range, e.g., 14 to 16 effective bits in a wide information bandwidth, e.g. 60–100 MHz centering at an IF frequency. Bandpass Delta Sigma modulators typically include a loop filter (also called a resonator for the bandpass modulator), a single bit or multi-bit quantizer, and a single bit or multi-bit feedback digital-to-analog converter (DAC). The loop filter structure can be a sampled-data discrete time filter or a continuous time filter. The discrete time filter is typically implemented in CMOS switched-capacitor technology that has relatively low signal bandwidth. The continuous time loop filter can be implemented in advanced bipolar technology that allows much higher amplifier bandwidth, faster settling and permits the complete modulator to sample at a higher clock rate. This in turn leads to wider signal bandwidth and superior dynamic performance.

A basic second order continuous time bandpass $\Delta\Sigma$ modulator ADC topology is described in "A 3.2 GHz Second-Order Delta-Sigma Modulator Implemented in InP HBT Technology," Jensen et al, IEEE J. Solid State Circuits, October 1995. The topology has a cascade of two integrators in series in a resonator configuration that drives a one bit comparator-DAC feedback. This topology does not have any compensation for delay in the loop. To achieve greater ADC dynamic range, this topology can be extended into a higher order $\Delta\Sigma$ modulator loop by cascading more of the same second order resonator loops. However this topology suffers from additional unnecessary delay in the signal path because of having all integrators cascading together in series, i.e., a $6^{th}$ order modulator would have 6 integrators in series. Excess delay impacts stability in a high order modulator structure.

A feedforward signal compensation method is described in "An Eighth-Order Bandpass $\Delta\Sigma$ Modulator for A/D Conversion in Digital Radio," Louis et al, IEEE J. Solid State Circuits, April 1999. The compensation method is applied to a sampled-data resonator (not a continuous time resonator) structure with all switched-capacitor integrators configured in cascade. This sampled data resonator structure has limited frequency bandwidth and is not preferred for digitizing wideband signal at greater than 100 MHz IF frequencies in today's process technologies. This structure also suffers from similar delay issues as discussed above.

SUMMARY OF THE DISCLOSURE

A continuous time Bandpass Delta Sigma ($\Delta\Sigma$) Modulator architecture with feedforward and feedback coefficients to completely specify both the signal transfer function (STF) and the noise transfer function (NTF) for a stable modulator ADC system is described. In an exemplary embodiment, the structure is capable of implementing any desirable noise shaping response for maximum dynamic range and producing optimal signal transmission response.

In an exemplary embodiment, the new architecture introduces an optimal number of feedforward elements to completely specify the frequency response of the modulator's signal transfer function (STF), hence producing any specified gain flatness and/or phase linearity. Without STF optimization from the feedforward technique, a general modulator topology suffers from much undesired gain variation, e.g., >10 dB may be observed across the signal bandwidth of interest, resulting in necessary gain correction in the digital signal processing (DSP) backend. A compensation technique in accordance with an aspect of the invention corrects for the inherent error in a general $\Delta\Sigma$ architecture and potentially reduces overall system complexity in subsequent DSP hardware.

In an exemplary embodiment, the topology configures the second integrator in a second order modulator in a local feedback such that only half as many integrators are in the forward signal path. An excess delay compensation technique can be integrated with the feedforward compensation technique.

BRIEF DESCRIPTION OF THE DRAWING

These and other features and advantages of the present invention will become more apparent from the following detailed description of an exemplary embodiment thereof, as illustrated in the accompanying drawings, in which:

FIG. 5 is a pole zero diagram in the z-plane of the STF response of the modulator of FIG. 2, showing the non-optimal zero locations.

FIG. 6 is a pole zero diagram, illustrating optimized pole zero locations for the sixth order modulator.

FIG. 7 is a plot of the STF and NTF frequency domain response of the optimized modulator with pole zero locations of FIG. 6.

FIG. 8 is a simplified schematic diagram of a $6^{th}$ order $\Delta\Sigma$ modulator embodying feed forward compensation in accordance with an aspect of the invention.

FIG. 9 is a simplified schematic diagram of an $n^{th}$ order $\Delta\Sigma$ Modulator, where n number of feedforward signals from the input are included to specify a prescribed signal transfer function to meet certain gain and/or phase characteristics.

DETAILED DESCRIPTION OF THE DISCLOSURE

Continuous time (CT) bandpass (BP) Delta Sigma ($\Delta\Sigma$) modulator Analog to Digital Converter (ADC) with multi-bit quantizer-DAC feedback is the preferred modulator ADC architecture to realize high resolution, high dynamic range wideband data converters. A topology in accordance with an aspect of the invention is capable of implementing a desired noise transfer function (NTF) characterized by high dynamic range, and also a prescribed signal transfer (STF) with certain gain and phase characteristics in the signal bandwidth.

Figure 1:
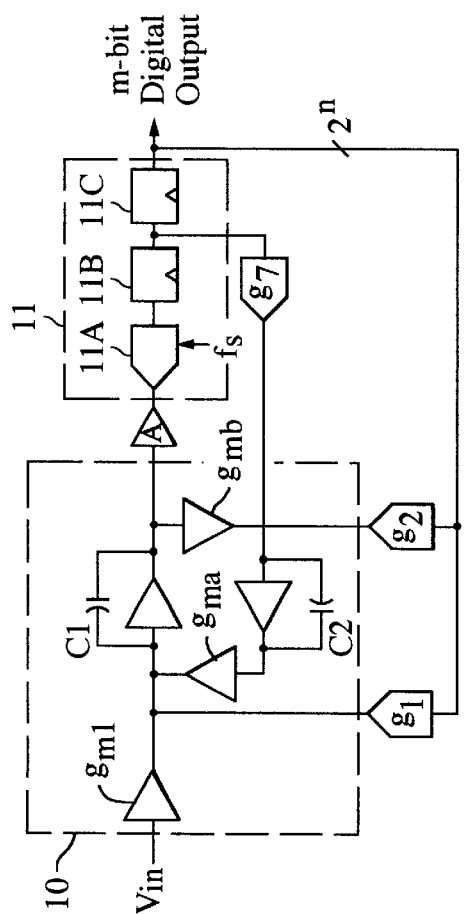
FIG. 1 shows a modified basic second order CT BP $\Delta\Sigma$ topology with excess delay compensation.

FIG. 1 shows a modified basic second order CT BP $\Delta\Sigma$ topology with excess delay compensation, as discussed in pending application 09/532,626, EXCESS DELAY COMPENSATION IN A DELTA SIGMA MODULATOR ANALOG-TO-DIGITAL CONVERTER, filed Mar. 22, 2000. The modulator topology includes a resonator core 10 comprising transconductance amplifiers $g_{ml}$ $g_{ma}$, $g_{mb}$ and integrators with integrating capacitors C1, C2. DACs g1 and g2 are feedback elements for the modulator. Amplifier $g_{ml}$ converts the input voltage into a current being summed with the DAC current produced by DAC $g_1$ into the integrator with capacitor C1. The C2 integrator is configured in the local feedback path such that the forward signal path consists of only the C1 integrator. This minimizes the signal delay in the forward transmission path that is significant for high order modulators, when a number of these resonator cores are connected in the cascade. The output of the resonator is passed through amplifier A to an m-bit quantizer 11 comprising a latching comparator 11A, and latches 11B and 11C. This topology also utilizes a multi-bit quantizer DAC $g_1$ to further improve the $\Delta\Sigma$ noise shaping increasing the dynamic range. This overall modulator topology is augmented with an additional feedback DAC g7 to compensate for excess delay.

Not shown in FIG. 1 is a conventional digital filter to define the signal passband bandwidth of interest in the spectrum. The digital filter is typically applied to the digital data outputs of the modulator.

Figure 2:
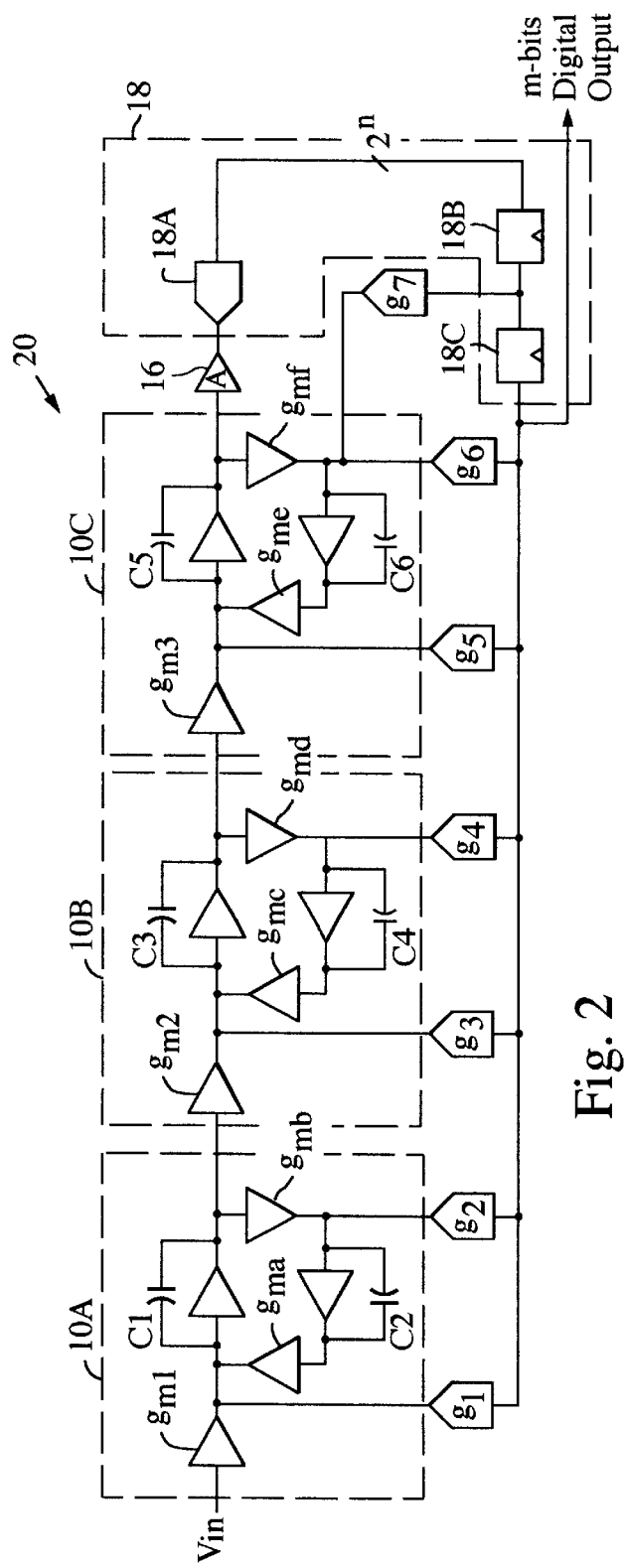
FIG. 2 is a simplified schematic diagram of a $6^{th}$ order $\Delta\Sigma$ modulator.

A $6^{th}$ order modulator 10 is shown in simplified schematic view in FIG. 2, and is extended from the topology in FIG. 1. The modulator of FIG. 2 comprises a cascade of the resonator cores 10 described above with respect to FIG. 1. Thus, the modulator includes in cascade resonator cores 10A, 10B, 10C. Amplifier 16 scales the signal from the resonator cascade and adjusts the modulator forward gain into the quantizer. The quantizer 18 is an m-bit latching comparator array 18A with a two latch (18B, 18C) array that is configured in a master-slave latch for each data bit. The m-bit digital output word can be obtained from latch 18C after the digital data is decoded into an m bit binary or grey coding format. The feedback DACs g1 and g2 driven by the quantizer are fed into the first resonator core 10A, feedback DACs g3 and g4 are fed into the second resonator core 10B, and feedback DACs g5 and g6 are fed into the third resonator core 10C. DAC g7 is an excess delay compensating DAC fed into resonator 10C.

Figure 3:
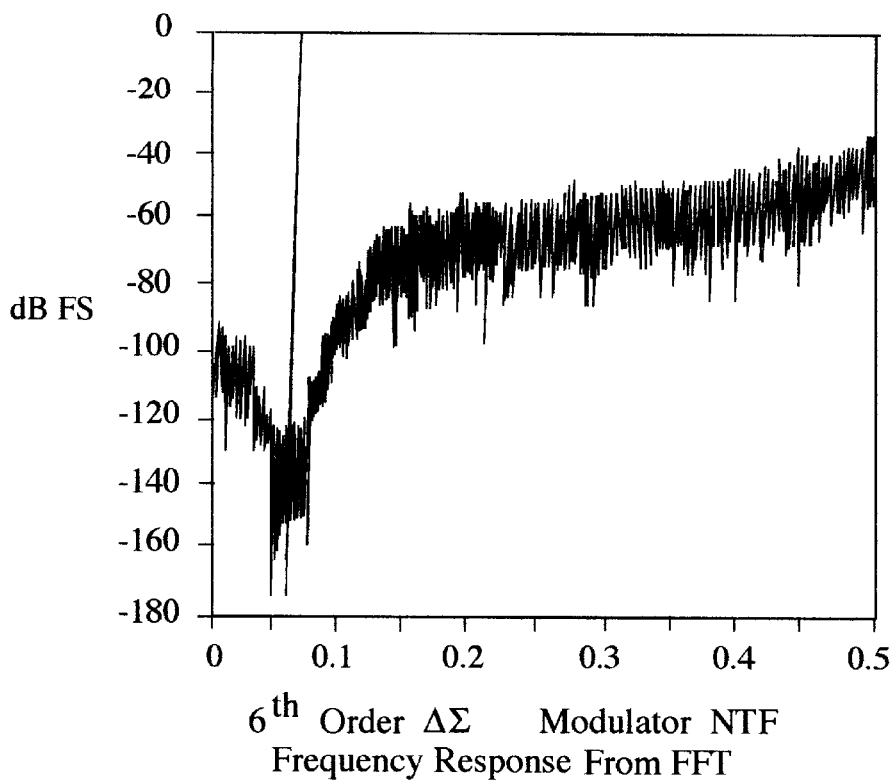
FIG. 3 shows the NTF frequency response from a Fast Fourier Transform (FFT) of the $6^{th}$ order modulator of FIG. 2.

The $6^{th}$ order modulator of FIG. 2 is analyzed with respect to its NTF and STF in the frequency domain and its pole zero placement of the transfer function in the z-plane. The zeros of the NTF are chosen to be placed in the passband for achieving a specific bandwidth while the poles of the NTF are chosen for a specified noise shaping response to maximize dynamic range. FIG. 3 shows the NTF frequency response from a Fast Fourier Transform (FFT) of the $6^{th}$ order modulator. Parameters in the topology can be selected to implement the following desired NTF realizing a specified dynamic range due to quantization noise limitation.

$$H_{ntf}(z) = \frac{1 - 5.5z + 13z^2 - 17z^3 + 13z^4 - 5.5z^5 + z^6}{.049 - .41z + 1.5z^2 - 3.1z^3 + 3.8z^4 - 2.8z^5 + z^6}$$

The foregoing equation is just one example of a transfer function that can be implemented by the topology of FIG. 2.

The gm's ($gm_a$–$gm_f$) and C's of each resonator stage are chosen to spread the zeros of the NTF in a desired passband signal bandwidth. The interstage gm's ($gm_2$ and $gm_3$) are set mainly to scale the integrator signal level/nodal voltage and do not directly impact the transfer functions. The feedback DAC gain value g's are selected to realize the pole locations of the NTF. After the parameters are selected for the desired NTF, the STF numerator will also be fixed by the same parameters from the NTF and cannot be altered without impacting the NTF. For this example, the STF becomes:

$$H_{stf}(z) = \frac{A_1(-1 - .91z + 7.7z^2 - 7.7z^3 + .9z^4 + z^5)}{.049 - .41z + 1.5z^2 - 3.1z^3 + 3.8z^4 - 2.8z^5 + z^6}$$

Figure 4:
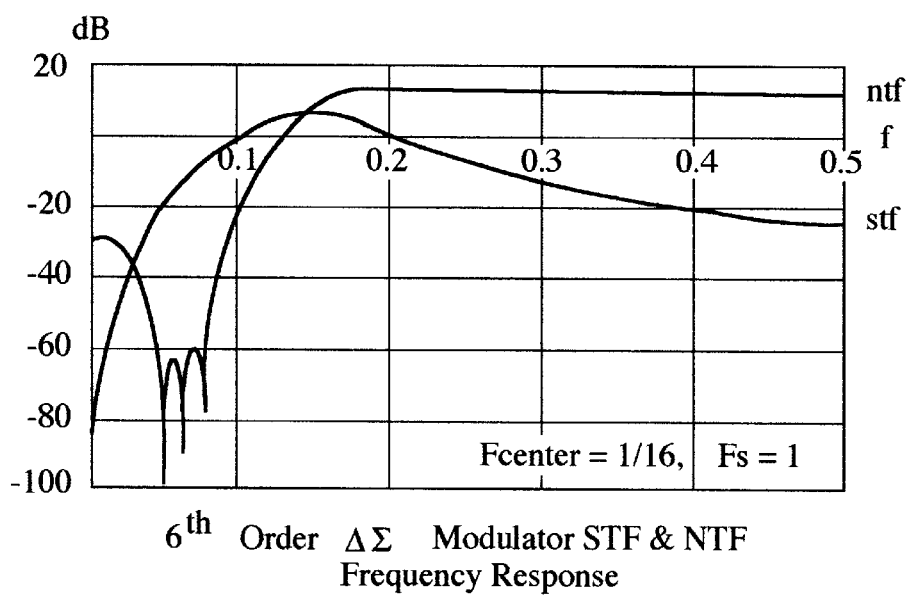
FIG. 4 is a plot of the STF and NTF frequency domain response of the modulator of FIG. 2.

The term $A_1$ in the STF is a gain factor that is a function of the input transconductance amplifier $gm_1$. When the STF is plotted in the frequency domain in FIG. 4, the gain variation can be observed to vary significantly over the desired signal band of interest. FIG. 4 also displays the NTF frequency response that shows the notch in the noise shape spanning the signal bandwidth of interest. The STF is observed to peak outside the signal bandwidth and has a rising response as the frequency is increasing in the signal band. The sampling frequency ($f_s$) for this design is normalized to be 1 Hz without loss of generality. The center frequency in the signal band is centered at $\frac{1}{16}$ of the sampling frequency, i.e., at 0.0625 Hz. With the over sampling ratio (OSR) of 16, the signal bandwidth occupies 0.03125 Hz. It can be seen from FIG. 4 that the gain variation is over 10 dB over the signal bandwidth. The pole zero diagram in the z-plane of the STF is plotted in FIG. 5 to show the non-optimal zero locations. Three zeros are clustered together near z=1 and one zero is outside the unit circle. There are non-optimal zero placements affecting the STF response even though the system is stable and implements a specified NTF. The six complex conjugate smaller circles along the right half of the unit circle are zeros of the NTF.

The $\Delta\Sigma$ modulators of FIG. 1 or FIG. 2 do not implement a prescribed STF characteristic. A desired STF characteristic is now discussed. The poles of the STF are the same as the NTF poles that are fixed to meet $\Delta\Sigma$ modulator noise shaping requirements achieving a certain dynamic range level. The zeros of the STF can be positioned with an optimization program such that an optimal STF with particular gain flatness response and/or phase response is met. The frequency response to the corresponding pole zero locations can be viewed, e.g. with the Sptool function in Matlab's Signal Processing Toolbox for filter design. As an example, it can be shown that after re-positioning the zero locations of the STF in FIG. 6, the following signal transfer function implements a frequency response with much less than 1 dB of gain variation over the signal bandwidth as shown in FIG. 7.

$$H_{stf}(z) = \frac{A_1(.046 - .24z + .12z^2 + .7z^3 - 1.3z^4 + z^5)}{.049 - .41z + 1.5z^2 - 3.1z^3 + 3.8z^4 - 2.8z^5 + z^6}$$

It is desirable to have the $\Delta\Sigma$ Modulator topology to be able to implement any specified signal transfer function response such that the gain and phase responses can be controlled. Additional signal feed-in parameters are needed to control the frequency response. It can be shown from State Space Formulation analysis of the $\Delta\Sigma$ Modulator structure where additional parameters are needed to shape the response.

When the state equations are written for the $6^{th}$ order $\Delta\Sigma$ Modulator topology in FIG. 2, it is in the form:

$$\dot{x}_c = Ax_c + B\begin{bmatrix} u_c \\ v_c \end{bmatrix}$$

$X_c$ is the continuous time state vector consisting of integrator output nodal voltages. The state matrix A is a function of resonator transconductance gm's, integrator capacitor C's and interstage gains $gm_2$, $gm_3$. $U_c$ is the input applied signal and $V_c$ is the feedback signal to the DAC's. The loop matrix B consists of sub-matrices $B_1$ and $B_2$ associated with the vector elements $U_c$ and $V_c$.

$$B = [\, B_1 \; B_2 \,],$$

$$B_1 = \begin{bmatrix} 0 & \frac{gm_1}{C_1} & 0 & 0 & 0 & 0 \end{bmatrix}^T$$

$$B_2 = \begin{bmatrix} \frac{g_2}{C_2} & \frac{g_1}{C_1} & \frac{g_4}{C_4} & \frac{g_3}{C_3} & \frac{g_6}{C_6} & \frac{g_5}{C_5} \end{bmatrix}^T$$

The vector $B_1$ is the section of the B matrix that relates to the feedforward coefficients that work with the input signal vector u. Vector $B_2$ is the section of the B matrix that relates to the feedback DAC coefficients $g_1$–$g_6$ that work with the feedback signal vector v. As seen in the vector $B_1$, all the entries related to the input signal $U_c$ are zeros because there is no signal branch to the corresponding nodes except for the second entry relating to the input $gm_1$ amplifier transconductance. There are not enough degrees of freedom to specify all the coefficients in the numerator of the STF to realize any prescribed transfer function. There would need to be 6 non-zero entries in the vector $B_1$ in order to realize the numerator of the STF of a $6^{th}$ order $\Delta\Sigma$ Modulator.

In order to completely specify the signal transfer function (STF) of a $6^{th}$ order $\Delta\Sigma$ modulator, in accordance with an aspect of the invention, the topology in FIG. 2 is augmented with 5 additional feedforward signals from the input Vin to the resonator blocks as shown in FIG. 8. The modulator 50 in FIG. 8 includes resonator cores 60A, 60B, 60C. For example, the resonator core 60A includes the corresponding elements of resonator core 10A (FIG. 2), and further includes feedforward elements gm1a, gm1b and feedback DAC elements g1 and g2. Amplifiers gm2 and gm3 are interstage gain elements between cores 60A and 60B, and between cores 60B and 60C. Amplifier gm1a also serves as an interstage amplifier stage, but also serves as part of the feedforward network that defines the signal transfer function. Thus, the modified resonator cores 60A, 60B, 60C include transconductance amplifiers gma, gmb, integrators with capacitors C1 and C2, feedforward amplifiers gm1a and gm1b, and feedback DACs g1 and g2. The three resonator cores are connected in cascade, with an m-bit quantizer 70 connected at the output of stage 60C to form a $6^{th}$ order Delta Sigma modulator 50 with feedforward compensation. The quantizer includes latching comparator 70A and latch array formed by latches 70B, 70C. Feedback DAC g7 is the excess delay compensating DAC element.

There is a total of 6 feedforward signal paths for the modulator 50 when the original input transconductance amplifier $gm_1$ path is included. When the state equations are written for the architecture, it can be shown that the vector $B_1$ consists of all non-zero terms. The gm terms in the $B_1$ vector include the feedforward transconductance gm's and the integrator capacitor C's. This allows complete specification of a desired signal transfer function.

$$B_1 = \begin{bmatrix} \frac{-gm_{1b}}{C_2} & \frac{-gm_{1a}}{C_1} & \frac{-gm_{2b}}{C_4} & \frac{-gm_{2a}}{C_3} & \frac{-gm_{3b}}{C_6} & \frac{-gm_{3a}}{C_5} \end{bmatrix}^T$$

When the z-domain signal transfer function is derived, the STF numerator coefficients of z are functions of the feedforward transconductance amplifier's gm values. When the modulator's signal transfer function is equated with the desired transfer function that has the prescribed response, the gm's in the $B_1$ vector can be uniquely solved such that the modulator has the desired frequency response. The NTF of the modulator is unchanged with the addition of feedforward signals. The STF response of the modulator 50 has the prescribed characteristic as in FIG. 7.

In one exemplary embodiment, the sampling frequency is at 1920 MHz and center frequency is at 120 MHz. While FIG. 8 shows a single ended signal path, with all signals from the input along the signal path through the circuits to the output referenced to a common ground, a fully differential signal path equivalent topology can be employed for better rejection of spurious signals. In such a case, both the positive and negative terminal of the signal path exists, and is not directly referenced to ground. Single-ended and differential equivalent topologies are well known to those skilled in the art.

This technique can be generalized for a $n^{th}$ order $\Delta\Sigma$ modulator, where n number of feedforward signals from the input are included to specify a prescribed signal transfer function to meet certain gain and/or phase characteristics. N number of feedforward coefficients can be solved to realize an $n^{th}$ order signal transfer function. FIG. 9 is a generalized block diagram of an $n^{th}$ order $\Delta\Sigma$ modulator 100, comprising resonator cores 110A, 110B, 110C, interstage gain elements gm2, gm3, . . . , m-bit quantizer 120, and excess delay compensating DAC element gn+1. By way of example, resonator core 110B comprises respective integrators with capacitors C3, C4, transconductance amplifiers gmc, gmd, feedforward amplifiers gm2a, gm2b, and feedback DACs g3, g4. The m-bit quantizer 120 comprises an n−1 bit latching comparator, in this case a $2^{M-1}$ bit latching comparator, and latch arrays 122, 124. The gn+1 feedback DAC is the excess delay compensating DAC element.

A generalized $\Delta\Sigma$ Modulator topology that can implement specific noise transfer function and signal transfer function characteristic has been introduced by adding feedforward signal compensation into the resonators.

It is understood that the above-described embodiments are merely illustrative of the possible specific embodiments that may represent principles of the present invention. Other arrangements may readily be devised in accordance with these principles by those skilled in the art without departing from the scope and spirit of the invention. For example, for some applications, the excess delay compensation might be excluded.

What is claimed is:

1. An analog-to-digital converter system with a continuous time bandpass Delta Sigma ($\Delta\Sigma$) modulator, for digitizing input signals of wide dynamic range, comprising:

an $n^{th}$ order $\Delta\Sigma$ modulator, comprising a cascaded series of resonators, where n number of feedforward signals from the input signal are included to specify a prescribed signal transfer function to meet predetermined gain and/or phase characteristics, and said n number of feedforward signals have associated therewith N feedforward coefficients to realize a $n^{th}$ order signal transfer function.

2. The system of claim 1, wherein each resonator comprises:

transconductance amplifiers gma, gmb and integrators with integrating capacitors C1, C2, and wherein the C2 integrator is configured in a local feedback path such that a forward signal path for the resonator consists of only the C1 integrator, minimizing the signal delay in the forward transmission path.

3. The system of claim 1, further comprising, for each resonator:

a first multi-bit digital-to-analog converter (DAC) in a feedback path from a system output to an input of the resonator; and a second DAC in a second feedback path from said system output to the resonator.

4. The system of claim 1, further including:

a quantizer circuit coupled to an output of a last one of the cascaded resonators, the quantizer including a latching comparator and a latch array.

5. The system of claim 4, further comprising:

a multi-bit digital-to-analog converter (DAC) in a feedback path from said quantizer circuit to said last one of the cascaded resonators.

6. The system of claim 1, further comprising n feedforward amplifier devices, each having associated therewith a corresponding one of said N feedforward coefficients.

7. The system of claim 1, wherein the cascaded series of resonators consists of n/2 resonators.

8. An analog-to-digital converter system with a continuous time bandpass Delta Sigma ($\Delta\Sigma$) modulator, for digitizing input signals of wide dynamic range, comprising:

a cascaded series of resonators, where n number of feedforward signals from the input signal are connected through n feedforward signal paths to specify a prescribed signal transfer function to meet certain gain and/or phase characteristics, with N feedforward coefficients associated with the feedforward paths to realize a $n^{th}$ order signal transfer function;

a quantizer circuit coupled to an output of a last one of said cascaded series of resonators to provide a digitized output corresponding to an analog input signal, the quantizer including a latching comparator;

for each resonator, a first multi-bit quantizer digital-to-analog (DAC) in first feedback path from said digitized output to an input of the resonator, and a second multi-bit DAC in a second feedback path from said digitized output to said the resonator.

9. The system of claim 8, wherein each resonator comprises:

transconductance amplifiers gma, gmb and integrators with integrating capacitors C1, C2, and wherein the C2 integrator is configured in a local feedback path such that a forward signal path for the resonator consists of only the C1 integrator, minimizing the signal delay in the forward transmission path.

10. The system of claim 8, further comprising n feedforward amplifier devices respectively disposed in the feedforword paths, each amplifier device having associated therewith a corresponding one of said N feedforward coefficients.

11. The system of claim 8, wherein the cascaded series of resonators consists of n/2 resonators.

12. The system of claim 8, further comprising a third multi-bit DAC in a third feedback path from said quantizer circuit to said last one of said cascaded series of resonators.

13. A method for digitizing an analog input signal, comprising:

providing an $n^{th}$ order Delta Sigma modulator, comprising a cascaded series of resonators;

providing n feedforward signal paths from the input signal to specify a prescribed signal transfer function to meet predetermined gain and/or phase characteristics, having associated therewith a corresponding feedforward coefficient to realize a $n^{th}$ order signal transfer function;

applying the analog input signal to the n feedforward signal paths;

quantizing an output of a last one of the cascaded resonators to provide a digital output.

\* \* \* \* \*